(12) United States Patent
Yabre et al.

(10) Patent No.: US 9,063,307 B2
(45) Date of Patent: Jun. 23, 2015

(54) PRINTED CIRCUIT BOARD ASSEMBLY AND A METHOD FOR MANUFACTURING THE PRINTED CIRCUIT BOARD ASSEMBLY

(75) Inventors: Gnitaboure Yabre, Mainvilliers (FR); Yves Stricot, Villepreux (FR)

(73) Assignee: FCI, Guyancourt (FR)

( * ) Notice: Subject to any disclaimer, the term of this patent is extended or adjusted under 35 U.S.C. 154(b) by 158 days.

(21) Appl. No.: 13/991,742

(22) PCT Filed: Dec. 7, 2011
(Under 37 CFR 1.47)

(86) PCT No.: PCT/IB2011/003251
§ 371 (c)(1),
(2), (4) Date: Nov. 12, 2013

(87) PCT Pub. No.: WO2012/076986
PCT Pub. Date: Jun. 14, 2012

(65) Prior Publication Data
US 2014/0119689 A1  May 1, 2014

(30) Foreign Application Priority Data
Dec. 8, 2010 (WO) .................. PCT/IB2010/003499

(51) Int. Cl.
*G02B 6/42* (2006.01)
*H05K 1/02* (2006.01)
*H05K 1/18* (2006.01)
*H05K 1/14* (2006.01)
*H05K 3/30* (2006.01)

(52) U.S. Cl.
CPC ......... *G02B 6/4269* (2013.01); *Y10T 29/49139* (2015.01); *G02B 6/4206* (2013.01); *G02B 6/4214* (2013.01); *G02B 6/428* (2013.01); *H05K 1/021* (2013.01); *H05K 1/0274* (2013.01); *H05K 1/141* (2013.01); *H05K 1/183* (2013.01); *H05K 2201/09845* (2013.01); *H05K 2201/10121* (2013.01); *H05K 2201/10416* (2013.01); *H05K 2201/10674* (2013.01); *H05K 3/306* (2013.01)

(58) Field of Classification Search
CPC ...................................... G02B 6/4269
See application file for complete search history.

(56) References Cited

U.S. PATENT DOCUMENTS

| 4,732,446 A | 3/1988 | Gipson et al. ............ 350/96.15 |
| 7,539,366 B1 | 5/2009 | Baks et al. ...................... 385/14 |

FOREIGN PATENT DOCUMENTS

| EP | 0 197 148 A1 | 11/1984 |
| WO | WO 2010/010395 A2 | 1/2010 |

*Primary Examiner* — Jerry Rahll
(74) *Attorney, Agent, or Firm* — Harrington & Smith

(57) ABSTRACT

Printed circuit board assembly including an optical subassembly having a carrying face for carrying at least one optoelectronic component in a such way that light emitted from/directed to is transmitted through the optical subassembly; a printed circuit board having a supporting area for supporting the optical subassembly; wherein the printed circuit board supporting area includes a hole lodging at least one part of the optoelectronic component and wherein at least one part of the carrying face is fixed by flip-chip bonding to at least one part of the supporting area.

21 Claims, 3 Drawing Sheets

PRINTED CIRCUIT BOARD ASSEMBLY AND A METHOD FOR MANUFACTURING THE PRINTED CIRCUIT BOARD ASSEMBLY

FIELD OF THE INVENTION

The instant invention relates to printed circuit board assembly and a method for manufacturing the printed circuit board assembly.

BACKGROUND OF THE INVENTION

Because of the ever increasing requirements in data rates in communication systems, due for example to the Internet, the limits of using electrical communications between printed circuit boards (PCB) are being reached. It has become difficult to guarantee good signal integrity when transferring information at high frequencies (e.g. 25 Gb/s or higher) through electrical lines between two electrical components such as a printed circuit board.

To respond to this bandwidth demand, high-speed systems now use optical waveguide light to transfer light-carried information.

Light enables to improve the transfer of information between two points since light is less sensitive to interference phenomenon. However, electronic infrastructures (such as telecom cabinet) still implement printed circuit boards which still use electricity-carried information. So, it is necessary to implement on the printed circuit board devices, designed for converting light to/from electricity and for directing light into/from the optical waveguide.

To this end, it has been proposed on the market devices such as optical transceiver and active optical cable which are capable to convert optical signal into electrical signal and vice versa. These devices comprise an active component also known as optical engine, whose function is to manage electrical/optical signal conversion.

An optical engine comprises a substrate, having electrical paths, which supports optoelectronic components configured for converting optical signal into electrical signal and vice versa.

In use these optical engine are mounted to a printed circuit board of the electronic system. For instance the printed circuit board can be a mother or daughter card of a backplane assembly or a printed circuit board of an Active Optical Cable.

It is known from WO2010/010395 an optical engine made of a transparent substrate (e.g. glass, glass ceramic, photoformable glass).

An object of the present invention is to propose an improved printed circuit board assembly in which the optical engine package is easy, effective and less costly.

SUMMARY OF THE INVENTION

To this aim, the printed circuit board assembly according to the invention comprises:
- an optical engine having a carrying face for carrying at least one optoelectronic component in a such way that light emitted from/directed to is transmitted through the optical engine; and
- a printed circuit board having a supporting face for supporting the optical engine.

The printed circuit board supporting face comprises a hole lodging at least one part of the optoelectronic component. At least one peripheral border of the carrying face is fixed by flip-chip bonding to at least one border of the supporting face, said border of the supporting face surrounding said hole.

With this feature, the optical subassembly is fixed to the printed circuit board.

Advantageously, the optoelectronic components are preserved from heat during the fixing of the subassembly to the printed circuit board.

Advantageously, a heat dissipator covers the optoelectronic components and protects them against pollution.

BRIEF DESCRIPTION OF THE DRAWINGS

Other characteristics and advantages of the invention will readily appear from the following description of two of its embodiments, provided as a non-limitative example, and of the accompanying drawings.

On the drawings.

On the different Figures, the same reference signs designate like or similar elements.

DETAILED DESCRIPTION

Figure 1:
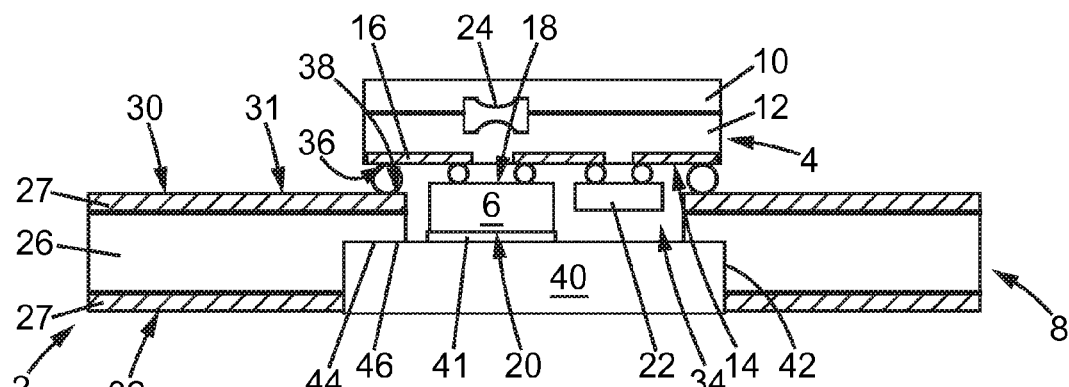
FIG. 1 is a schematic side view of a printed circuit board assembly according to a first embodiment of the invention.

Referring to FIG. 1, the printed circuit board assembly 2 according to the invention comprises an optical engine 4 for carrying at least one optoelectronic component 6 and a printed circuit board 8 also named mother board, configured for supporting the optical engine 4.

The optical engine 4 comprises two staked layers 10, 12. These layers 10, 12 are made of transparent material such as plastic, moulded glass or fused silica.

One principal face 14 of the lower layer 12 is provided with the optoelectronic components 6 as well as with electrical tracks 16 for interconnecting the optoelectronic components. This principal face 14 is named hereafter carrying face 14.

The optoelectronic components 6 are electrically linked and mechanically fixed to the electrical tracks 16 by flip-chip bonding. In the present description, the face of the optoelectronic components 6 which is attached to the electrical tracks 16 and to the lower layer 12 is named assembling face 18 and the opposite face is named back face 20.

The optoelectronic components 6 include among other light-emitting optoelectronic devices such as vertical-cavity surface emitting lasers (VCSEL) and light-receiving optoelectronic devices such as photo-diodes or photo-detectors. The optoelectronic component 6 may be electrically connected to an electronic control device 22 configured for driving them. The device 22 may also be mounted through flip-chip on the carrying face 14 of the engine 4.

On the schematic representation of FIG. 1, only one optoelectronic component 6 is visible. In reality, the optical engine 4 carries several optoelectronic components 6 arranged in rows and possibly in rows and columns.

Light beams coming from or going to the optoelectronic components 6 cross the optical engine 4 widthways.

At least one light-beam forming structure, typically a lens 24 can be formed for example by laser cutting in the optical engine 4. This lens is, for example, adapted to collimate a light beam coming from an optoelectronic component 6 and going to, for example, a non represented optical device adapted to guide the light beam towards an optical fibre.

The printed circuit board 8 usually comprises a substrate 26 made of epoxy resin prepreg or glass fibre covered on one side or on both sides with a thin copper foil 27 coated with a solder mask. On the embodiment illustrated on FIG. 1, electronic components (not represented) are deposited on the top face 30 and on the bottom face 32 of the printed circuit board 8. These electronic components are generally electrically linked to the optoelectronic components 6 and/or the control device 22.

The printed circuit board 8 comprises a hole 34 adapted to lodge the optoelectronic components 6. The optical engine 4 is fixed by flip-chip bonding to the printed circuit board 8. In particular, one part of the carrying face 14 of the optical engine 4 is electrically and mechanically fixed by flip-chip bonding to one part of a supporting area 31 of the printed circuit board. According to the embodiment shown on this figure, the peripheral border 36 of the carrying face 14 is fixed by flip-chip bonding to the border 38 surrounding the hole 34 of the printed circuit board. The hole 34 has, for example, a rectangular or a square shape.

In variant, electrical tracks are deposited only on one face of the printed circuit board 8. According to another variant, the printed circuit board is a multilayer circuit board.

In variant, only one side of the border 36 of the carrying face 14 is fixed by flip-chip bonding to one side of the border 38 of the hole.

According to the embodiment illustrated on FIG. 1, a heat dissipator 40 is fixed to the back face 20 of the optoelectronic component 6. The attachment material 41 can be, for instance, tape, thermal grease, pressure sensitive adhesive, glue or epoxy. The heat dissipator 40 can be a heat sink or a heat spreader.

Advantageously, the heat dissipator 40 is adapted to cool the optoelectronic components 6 and the control device 22 during the flip-chip bonding of the border 36 of the engine 4 to the border 38 of the printed circuit board.

Advantageously, the heat dissipator 40 also cools the electronic components 6 and the control device 22 during the use of the printed circuit board assembly 2.

Advantageously, the heat dissipator 40 covers the optoelectronic components 6 and protects them against pollution.

According to the embodiment illustrated on FIG. 1, the printed circuit board 8 comprises a cavity 42 for accommodating the heat dissipator 40. This cavity 42 mouths in the hole 34.

This cavity 42 has advantageously an area superior to the area of the hole 34 when considering that the area of the hole 34 and the area of the cavity is measured in planes parallel to the top face 30 plane. This embodiment allows the implementation of large heat dissipator 40. In such case, the upper peripheral surface 44 of the heat dissipator 40 can furthermore be fixed to a shoulder 46 formed between the hole 34 and the cavity 42.

In variant, the heat dissipator 40 is only fixed to the shoulder 46 and not to the back face 20 of the optoelectronic components 6. In such case, the heat dissipator 40 is preferably in thermal contact with the optoelectronic component 6 to cool them.

In variant, the hole 34 is a through hole and the heat dissipator 40 is lodged in this though hole.

On FIG. 1, the heat dissipator 40 is entirely housed in the cavity 42 such that the bottom face 32 of the printed circuit board is flat. In variant, only a part of the heat dissipator 40 is housed in the cavity 42, the other part forming a protrusion with respect to the bottom face 32 of the printed circuit board.

Figure 2:
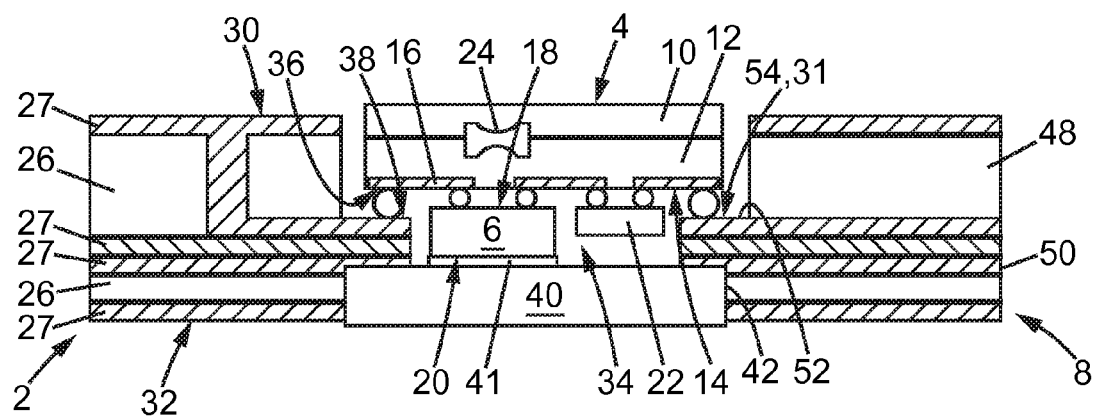
FIG. 2 is a schematic side view of a printed circuit board assembly according to a second embodiment of the invention.

FIG. 2 schematically shows a second embodiment of the invention. Compared to the first embodiment, it mainly differs in that the printed circuit board 8 is a multilayer circuit board, i.e. it comprises a first printed circuit board 48 including a substrate layer 26 coated on both sides with a copper foil 27, and a second printed board 50 including three copper foils 27 and a substrate layer 26. A spot facing or shoulder 52 is formed in the hole 34 such that the top face 54 of the shoulder 52 is opposite to the carrying face 14 of the optical engine 4. This top face 54 is the top face of a copper foil 27. The border 36 of the optical engine 4 is fixed by flip-chip bonding to this shoulder 52.

Figure 3:
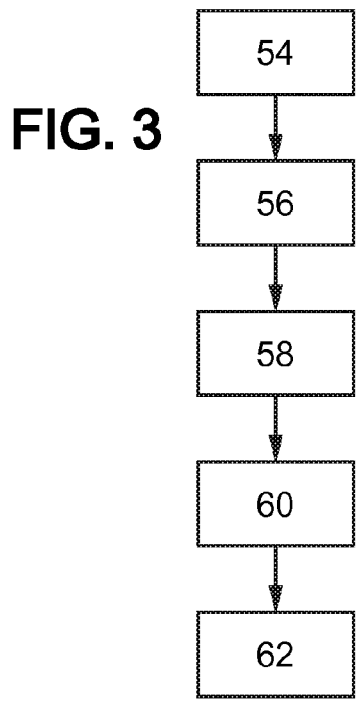
FIG. 3 is a diagram illustrating the steps of the method for manufacturing the printed circuit board assembly according to the invention.

Advantageously, the depth between the shoulder 52 and the top face of the printed circuit board is chosen for being similar to the thickness of the optical engine 4 such that the printed circuit board assembly is flat. In reference to FIG. 3, the method of manufacturing a printed circuit board assembly according to the invention comprises the following steps:

providing 54 an optical engine 4 having a carrying face 14 carrying at least one optoelectronic component 6 in a such way that the light emitted from/directed to the optoelectronic component 6 is transmitted through the optical assembly 4;

providing 56 a printed circuit board having a supporting area 31 configured for supporting the optical engine 4;

forming 58 a hole in the supporting face for lodging at least one part of the optoelectronic component 6;

fixing 60 by flip-chip bonding at least one peripheral border 36 of the carrying face 14 to at least one border 38 of the supporting area 31, said border 38 surrounding said hole 34;

attaching 62 a heat dissipator 40 to a back face of the optoelectronic component 6; the back face 20 being the face opposite to the assembling face 18 of the optoelectronic component 6.

Advantageously, the step of fixing the peripheral border 36 of the carrying face 14 to the border 38 of the supporting area 31 is performed simultaneously to attach a heat dissipator 40 to the back face 20 of the optoelectronic component.

In variant, the method comprises a step of forming a shoulder 52 in the printed circuit board and the fixing step is a step of fixing one part of the carrying face 14 to one part of the shoulder 52.

Figure 4:
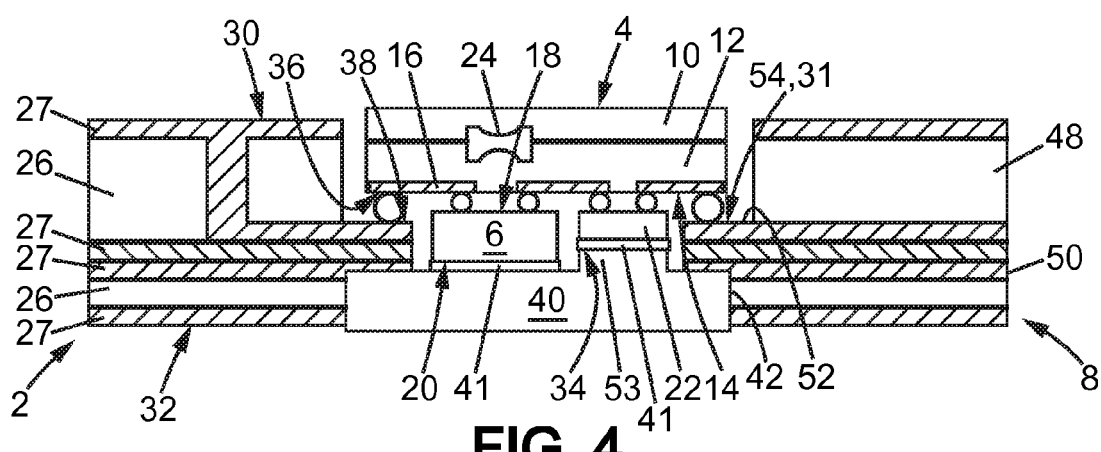
FIG. 4 is a schematic side view of a printed circuit board assembly according to a third embodiment of the invention.

FIG. 4 schematically shows a third embodiment of the invention. Compared to the second embodiment, it mainly differs in that the heat dissipator 40 comprises a protuberance 53. This protuberance 53 has a flat face which is fixed to the electronic control device 22. In particular, the electronic control device 22 has one face fixed to the optical engine 4 and an opposite face fixed to the heat dissipator. The protuberance's height is equal to the thickness difference between the optoelectronic component 6 and the electronic control device 22.

In variant, the heat dissipator 40 presents a hole having a depth which is equal to the difference between the thickness of the optoelectronic component 6 and the thickness of the electronic control device; the optoelectronic component 6 being fixed to the back face of this hole.

Figure 5:
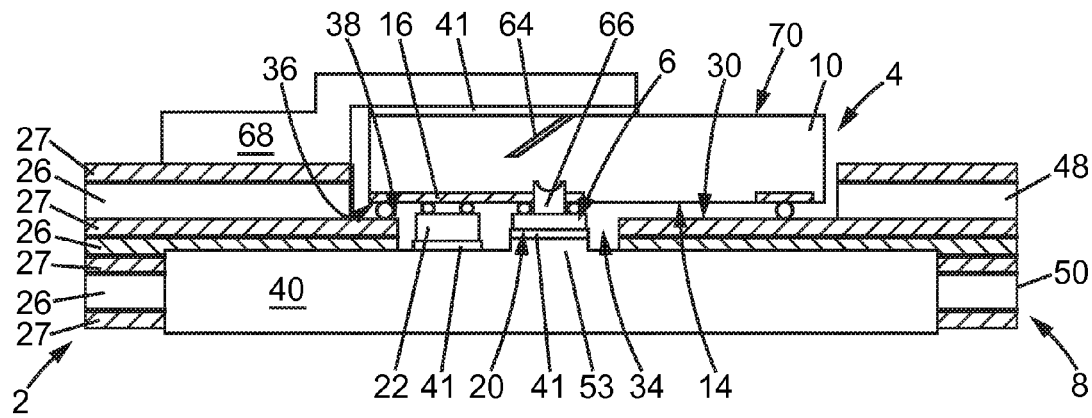
FIG. 5 is a schematic side view of a printed circuit board assembly according to a fourth embodiment of the invention.

FIG. 5 schematically illustrates a fourth embodiment of the invention. This embodiment is similar to the second embodiment.

In this case, the thickness of the optoelectronic component 6 is inferior to the thickness of the electronic control device 22 so that the heat dissipator 40 is provided with a protuberance 53 positioned under the optoelectronic component 6. The flat extremity face of the protuberance is fixed to the back face 20 of optoelectronic component 6. The protuberance's height is equal to the thickness difference between the optoelectronic component 6 and the electronic control device 22.

According to this embodiment, the optical engine 4 comprises only one layer 10 made of transparent material.

The optical engine 4 comprises a reflective arrangement 64 adapted to guide the light beam from/directed to the optoelectronic component 6 to/from a plane parallel to the top face 30 of the printed circuit board 8. This reflective arrangement 64 is inclined at an angle of 45° with respect to the top face 30 of the printed circuit board. This reflective arrangement 64 can for example be made by laser cutting.

According to this embodiment, a lens 24 is not built up within the optical engine 4. Instead, a lens 66 is fixed or formed on the carrying face 14 of the optical engine 4. The lens 66 is configured for collimating the light beam output from the laser.

According to this embodiment, the printed circuit board assembly 2 also comprises a second heat dissipator 68 adapted to cool the optical engine 4 during the transmission and reception of light beams. This second heat dissipator 68 is fixed, on one hand, on a face 70 of the optical engine 4 opposite the carrying face 14, and on the other hand, on the top face 30 of the printed circuit board. These fixations are achieved through, for example, tape, thermal grease, pressure sensitive adhesive, glue, epoxy, a clip or a screw.

The second heat dissipator 68 can be a heat spreader or a heat sink.

On FIG. 5, the second heat dissipator 6 has a stair shape. However any other shape like an L shape would be suitable.

Figure 6:
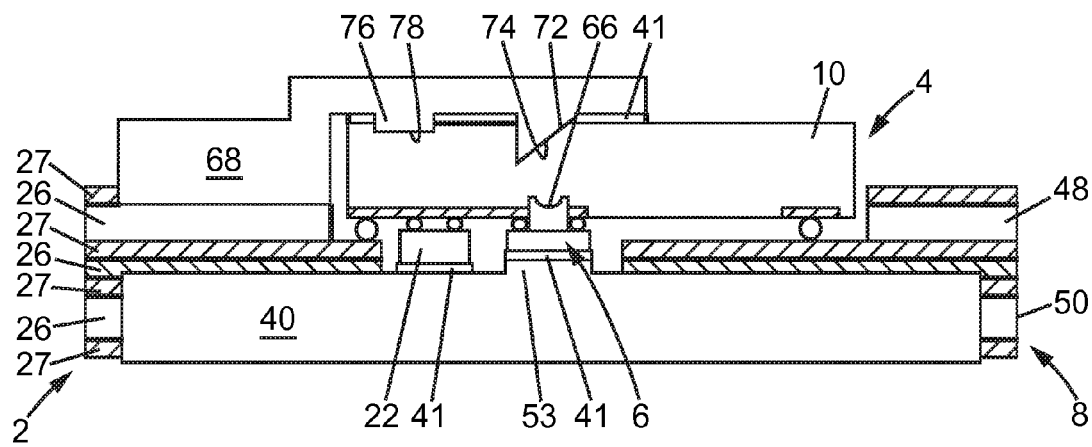
FIG. 6 is a schematic side view of a printed circuit board assembly according to a fifth embodiment of the invention.

The fifth embodiment of the invention shown on FIG. 6 is similar to the fourth one at the exception that the second heat dissipator 68 is provided with a protruding reflective arrangement 72 adapted to accomodate a corresponding cavity 74 of the optical engine 4. The reflective arrangement 72 is inclined at an angle of 45° with respect to the top face 30 to guide the light beam from/directed to the optoelectronic component 6 to/from a plane parallel to the top face 30 of the printed circuit board 8. The reflective arrangement 72 is for example made by surface treatment of an area of the second heat dissipator's protrusion.

The cavity 74 is formed in the optical engine 4 in front of the optoelectronic component 6, for example by laser cutting.

The reflective arrangement 72 and the cavity 74 form also positioning elements, i.e. elements adapted to passively position the second heat dissipator 68 with respect to the optical engine 4.

According to the embodiment illustrated on FIG. 6, the second heat dissipator 68 and the optical engine 4 comprise supplementary positioning elements 76, 78. For example, a pin or a bulge 76 can be built in the second heat dissipator 68 and a corresponding aperture 78 can be formed in the optical engine 4.

Advantageously, these positioning elements allow a quick, simple and precise mounting of the second heat dissipator 68 to the optical engine 4.

The invention claimed is:

1. Method of manufacturing a printed circuit board assembly, said method comprising:
    providing an optical engine having a carrying face carrying at least one optoelectronic component; the optoelectronic component being fixed to the carrying face in a such way that the light emitted from/directed to the optoelectronic component is transmitted through the optical engine;
    providing a printed circuit board having a supporting area supporting the optical engine;
    forming a hole in the supporting area for lodging at least one part of the optoelectronic component; and
    fixing by flip-chip bonding at least one part of the carrying face to at least one part of the supporting area;
    attaching a heat dissipator to a back face of the optoelectronic component; the back face being disposed opposite to an assembling face of the optoelectronic component; said assembling face being the face of the optoelectronic component which is fixed to the optical subassembly;
    wherein fixing one part of the carrying face to one part of the supporting area is performed simultaneously to attaching a heat dissipator to the back face of the optoelectronic component.

2. Method of manufacturing according to claim 1, wherein it comprises forming a shoulder in the hole, and wherein the fixing step is a step of fixing at least one peripheral border of the carrying face to the shoulder.

3. Method of manufacturing according to claim 1, wherein the fixing step is a step of fixing at least one peripheral border of the carrying face to at least one border of the supporting area, said border of the supporting area surrounding said hole.

4. Printed circuit board assembly comprising:
    an optical engine having a carrying face for carrying at least one optoelectronic component; the opto-electronic component being fixed to the carrying face in a such way that light emitted from/directed to is transmitted through the optical engine;
    a printed circuit board having a supporting area for supporting the optical engine; wherein the printed circuit board supporting area comprises a hole lodging at least one part of the optoelectronic component and wherein at least one part of the carrying face is fixed by flip-chip bonding to at least one part of the supporting area;
    wherein an assembling face of the optoelectronic component is fixed to the optical engine and wherein a first heat dissipator is attached to a back face of the optoelectronic component, the back face being the face opposite to the assembling face of the optoelectronic component; and
    wherein at least one part of the first heat dissipator is lodged into the hole of the printed circuit board.

5. Printed circuit board assembly according to claim 4, wherein the printed circuit board comprises a cavity mouthing in said hole; said cavity being configured for accommodating the first heat dissipator.

6. Printed circuit board assembly according to claim 5, wherein the area of the cavity measured with respect to a plane parallel to the supporting area is larger than the area of the hole measured with respect to a plane parallel to the supporting area.

7. Printed circuit board assembly according to claim 4, wherein the first heat dissipator is a heat spreader.

8. Printed circuit board assembly according to claim 4, wherein the first heat dissipator is a heat sink.

9. Printed circuit board assembly according to claim 4, wherein a shoulder is formed in the hole and wherein at least one part of the carrying face is fixed to this shoulder.

10. Printed circuit board assembly according to claim 4, wherein the heat dissipater is fixed to the printed circuit board.

11. Printed circuit board assembly according to claim 4, wherein the optical engine features at least one of the following features:
- it has a translucent substrate,
- it comprises a light-beam forming structure,
- it carries an electronic control device connect on its carrying face, and electrical tracks to electrically connect the electronic control device to the optoelectronic component.

12. Printed circuit board assembly according to claim 4, wherein at least one peripheral border of the carrying face is fixed by flip-chip bonding to at least one border of the supporting face, said border of the supporting face surrounding said hole.

13. Printed circuit board assembly according to claim 4, wherein the first heat dissipator comprises a protuberance having a flat extremity face to which one face of the optoelectronic component is fixed.

14. Printed circuit board assembly according to claim 4, wherein the carrying face of the optical engine is adapted to carry an electronic component and wherein the first heat dissipator comprises a protuberance having a flat extremity face to which one face of the electronic component is fixed.

15. Printed circuit board assembly according to claim 4, wherein the hole is a through hole.

16. Printed circuit board assembly according to claim 4, further comprising a second heat dissipator adapted to cool the optical engine; the second heat dissipator being fixed to the optical engine and to the printed circuit board.

17. Printed circuit board assembly according to claim 16, wherein the second heat dissipator comprises a protruding reflective arrangement adapted to guide the light beam from/directed to the optoelectronic component to/from a plane parallel to the printed circuit board, and wherein a cavity is formed in the optical engine to accommodate said protruding reflective arrangement.

18. Printed circuit board assembly according to claim 16, wherein the second heat dissipator comprises a positioning element and the optical engine comprises a complementary positioning element for cooperating with the positioning element.

19. Printed circuit board assembly, according to claim 16, wherein the second heat dissipator is a heat spreader.

20. Printed circuit board assembly, according to claim 16, wherein the second heat dissipator is a heat sink.

21. Printed circuit board assembly according to claim 4, wherein the optical engine comprises a reflective arrangement adapted to guide the light beam from/directed to the optoelectronic component to/from a plane parallel to the printed circuit board.

* * * * *